United States Patent
Maille et al.

(10) Patent No.: US 9,030,475 B2
(45) Date of Patent: May 12, 2015

(54) METHOD OF COMPUTER-AIDED DESIGN OF A MODELED OBJECT HAVING SEVERAL FACES

(75) Inventors: Joran Maille, Clamart (FR); Remy Rorato, Paris (FR)

(73) Assignee: Dassault Systemes, Suresnes Cedex (FR)

( * ) Notice: Subject to any disclaimer, the term of this patent is extended or adjusted under 35 U.S.C. 154(b) by 1841 days.

(21) Appl. No.: 11/402,371

(22) Filed: Apr. 7, 2006

(65) Prior Publication Data

US 2007/0027665 A1 Feb. 1, 2007

(30) Foreign Application Priority Data

Apr. 8, 2005 (EP) .................. 05290789

(51) Int. Cl.
*G06T 15/30* (2011.01)
*G06T 17/20* (2006.01)
*G06F 19/00* (2011.01)
*G06F 17/50* (2006.01)

(52) U.S. Cl.
CPC ............ *G06F 17/50* (2013.01); *Y10S 715/964* (2013.01); *Y10S 706/919* (2013.01); *Y10S 706/92* (2013.01)

(58) Field of Classification Search
USPC .............. 345/419–420, 423; 700/98, 182; 706/919–920; 715/964
See application file for complete search history.

(56) References Cited

U.S. PATENT DOCUMENTS

| | | | |
|---|---|---|---|
| 5,353,395 A | 10/1994 | Tokumasu et al. | |
| 2001/0033281 A1* | 10/2001 | Yoshida et al. | 345/420 |
| 2001/0043209 A1* | 11/2001 | Nagakura | 345/419 |
| 2005/0154481 A1* | 7/2005 | Berger et al. | 700/98 |

OTHER PUBLICATIONS

"SMLib Tutorial", Solid Modeling Solutions, Aug. 11, 2004, pp. 1-9, XP002333831, http://www.smlib.com/Manual/SMLibTutorial.html.
Chen, Yuh-Min, et al., "Cost-effective design for injection molding", Robotics and Computer-Integrated Manufacturing, Feb. 1999, vol. 15, No. 1, pp. 1-21.
Elber, Gershon, et al., "Filleting and Rounding using Trimmed Tensor Product Surfaces", Proceedings of the Fourth Symposium on Solid Modeling and Applications, Atlanta, GA, May 14-16, 1997, pp. 206-216.
Choi, B. K., et al., "Constant-radius blending in surface modelling", Computer-Aided Design, May 1989, vol. 21, No. 4, pp. 213-220.
Chuang, Chen-Ming, et al., "A new approach to z-level contour machining of triangulated surface models using fillet endmills", Computer-Aided Design, Sep. 2005, vol. 37, No. 10, pp. 1039-1051.
Vida J. et al., "A Survey of Blending Methods that use Parametric Surfaces," Computer-Aided Design, vol. 26, No. 5, May 1994, Jordan Hill, Oxford, GB, pp. 341-365.

* cited by examiner

*Primary Examiner* — Tize Ma
(74) *Attorney, Agent, or Firm* — Baker & Hostetler LLP

(57) ABSTRACT

A method for computer-aided design of a modeled object having several faces, comprising a steps of identifying, for each of said faces of the object, at least another of said faces related to said face according to geometrical criteria, and marking such faces as connected; computing a plurality of points forming a tessellated representation of each of said faces; based on this tessellation, defining critical regions by determining and storing data representative of intersection between a three-dimensional geometrical figure and the face related to said face; determining whether intersections occur for each point of the tessellated representation of a face and for each face of the object; computing frontiers between points according to their respectively stored data and determines zones according to the determined frontiers; and, re-computing surfaces according to the determined zones.

21 Claims, 12 Drawing Sheets

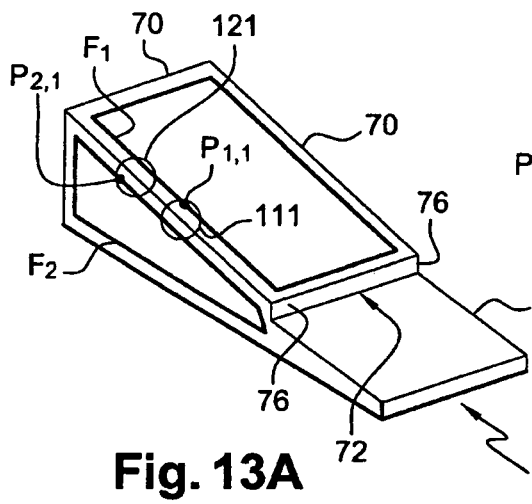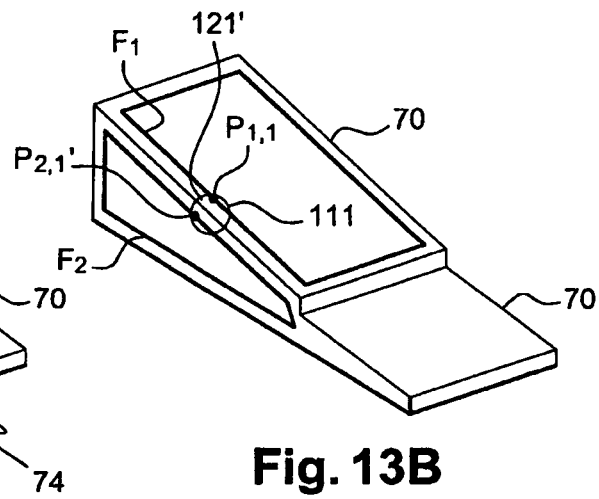
Fig. 13A  Fig. 13B
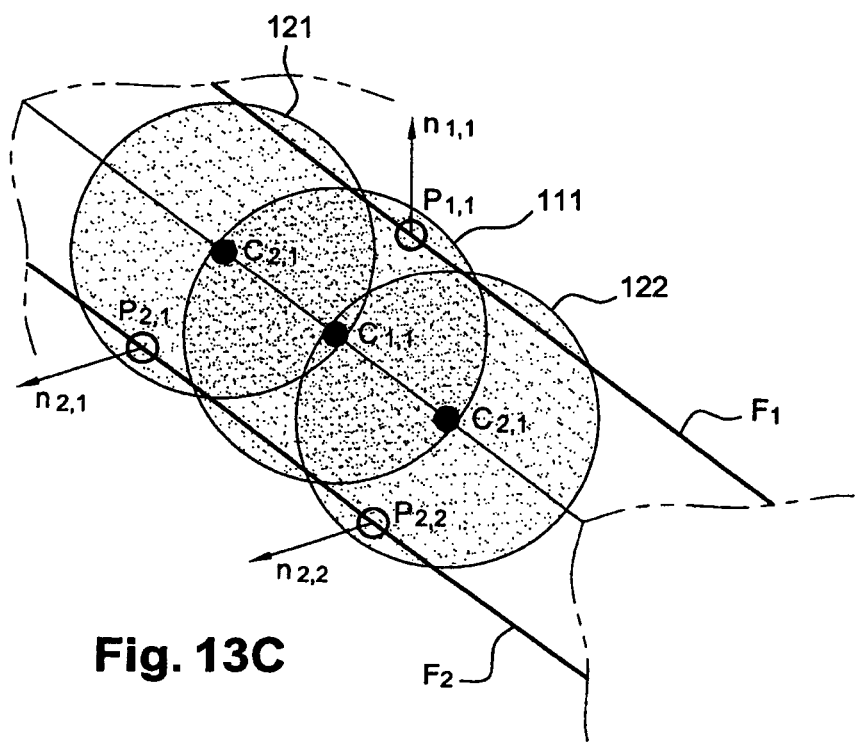
Fig. 13C

METHOD OF COMPUTER-AIDED DESIGN OF A MODELED OBJECT HAVING SEVERAL FACES

CROSS REFERENCE TO RELATED APPLICATIONS

This application claims priority to European Patent Application No. 05290789.6, filed on Apr. 8, 2005, which is currently pending.

FIELD OF THE INVENTION

The invention relates to the field of computer programs and systems, and more specifically to the field of computer-aided design (CAD) systems and computer-aided manufacturing (CAM).

BACKGROUND OF THE INVENTION

A number of systems and programs are offered on the market for the design of parts or assemblies of parts, such as the one provided by DASSAULT SYSTEMES under the trademark CATIA. These systems and programs, also called computer-aided design (CAD) systems, allow a user to construct and manipulate complex three dimensional (3D) models of objects or assemblies of objects. CAD systems thus provide a representation of modeled objects using edges or lines, in certain cases with faces. Lines or edges may be represented in various manners, e.g., non-uniform rational B-splines (NURBS). These CAD systems manage parts or assemblies of parts as modeled objects, which are mainly specifications of geometry. In particular, CAD files contain specifications, from which geometry is generated. From geometry, a representation is generated. Specifications, geometry and representation may be stored in a single CAD file or multiple ones. CAD systems include graphic tools for representing the modeled objects to the designers; these tools are dedicated to the display of complex objects—the typical size of a file representing an object in a CAD system extending up to the range of a Mega-byte for part, and an assembly may comprise thousands of parts. A CAD system manages models of objects, which are stored in electronic files.

Obviously, modeled objects designed with the help of CAD systems aim at resembling as closely as possible to the final fabricated product, at least for some applications.

For example, in the field of product/part molding, use is made of molds which can be regarded as continuous faces, possibly separated by sharp edges. The real edges—e.g., of the real molds—are however not perfectly sharp edges but rather show slightly rounded or filleted sections. Thus, when such features are neglected in the corresponding theoretical model, the quantity of material needed for molding slightly differs from that expected from the theoretical model. Obviously, such details may be seen as unimportant as long as one focus on the overall agreement between real and modeled objects. However, this may become of importance when considering mass/continuous production, where the differences between theoretical and real quantity of material necessary for production are substantial, for example during one year. As a simple example, let us consider mass production of a cubic molded product, with edge length L. The rounding of the twelve edges of the cube (sometimes called "beveling") that occurs with real molding amounts to remove a volume of $3\ L\ r^2\ (4-\pi)$, where r is the radius of the osculating circle. Thus, considering for instance r=L/10, the difference between the volume of the perfect cube and that of the final product amounts to about 2.6%. Therefore, one understands that it is needed to predict as faithfully as possible the features of the final "real" product, should it be for improving forecasting. In other words, it is necessary to improve the agreement between theoretical and real models. In this respect and for some specific applications, e.g., manufacturability or esthetic reasons, CAD users sometimes have to replace sharp edges of theoretical molds or products by rounded edges.

To achieve this, the classic modeling approach is to create fillet-like sections (e.g., a radius to apply on concave edges) of round-like sections (radius to apply on all convex edges) of product edges, one by one. As illustrated in FIG. 1, a model product 10 may thus subsequently exhibit a fillet-like section 12 (hereafter referred to as "fillet") and/or rounded sections 14 (hereafter "rounds").

FIG. 2 shows typical results of steps of design of rounds 14 and fillets 12 for a model product 10, as a one-by-one process. Creating rounds and/or fillets according to such a process becomes quickly very complicated when the number of element to model increases. The user has to respect a certain order of steps, which may vary according to the modeled object. If not, the rounding or filleting design may fail. The complexity of the modeled object (multiplicity of edges, corner areas, etc.) may be an additional source of failure. In particular, modeling rounds or fillet where edges collide (corners, hard zones, etc.) is a torment. Further, traditional filleting process constrains the model to be made of valid closed geometry between each operation (due to internal constraints in the algorithms used). This constraint often leads manual filleting or rounding to fail. To avoid that, the user has to spend a huge amount of time in order to determine the sequence of creation of the fillets or rounds needed to modify the sharp edges.

Therefore, there is a need for a solution improving the efficiency of product surface fine design and, in particular, improving the rounding and/or filleting process.

SUMMARY OF THE INVENTION

The invention proposes a method of computer-aided design of a modeled object having several faces, the method comprising the steps of:
identifying, for each of said faces, at least another of said faces related to said face according to geometrical criteria;
computing a plurality of points forming a tessellated representation of each of said faces;
for each of said faces;
  for each point of the tessellated representation of said face;
  determining and storing data representative of an intersection between a three-dimensional geometrical figure touching said point and another face identified as a face related to said face;
  computing frontiers between points according to their respectively stored data;
  determining zones according to the computed frontiers; and
  computing new faces according to the determined zones.
In other embodiments, the process according to the invention may comprise one or more of the following features:
  each point of the plurality of points forming the computed tessellated representation is a vertex of a tessellation polygon;
  the step of computing frontiers comprises determining a frontier point on a segment linking vertices with stored data indicative of an intersection and of no intersection, respectively;

the step of computing frontiers comprises, prior to computing the frontier point, subdividing polygons having vertices with stored data indicative of an intersection and of no intersection, respectively;

said data is representative of an amount of the intersection between said figure and said another face the method further comprises a step of user selection of a face not to be processed and subsequent removal of this face from the faces to be processed the method further comprises a step of extrapolating faces adjacent to the face removed;

the geometrical criteria comprise at least: the exterior angle of the faces to be identified as related faces is between 180.5° and 360° the step of determining and storing data representative of an intersection is further carried out for each couple of faces related via a face selected by a user;

the step of determining zones comprises determining one or more zone comprising an edge and having a fillet-like or round-like section, by calling a coupling routine using a function $f_1$ and a condition $C_1$;

the step of determining zones comprises determining one or more zone comprising two edges with a minimal distance less than a dimension related to the three dimensional object and having a step-like section, by calling a coupling routine using a function $f_2$ and a condition $C_2$;

the step of determining zones comprises determining one or more zone comprising two substantially parallel face portions separated by at least two edges with a minimal distance less than a dimension related to the three dimensional object and having a wall-like section, by calling a coupling routine using a function $f_3$ and a condition $C_3$;

the step of determining zones comprises determining one or more zone comprising an edge and having a fillet-like or round-like section, by calling a coupling routine using a function $f_1$ and a condition $C_1$; then determining one or more zone comprising two edges with a minimal distance less than a dimension related to the three dimensional object and having a step-like section or respectively a wall-like section, by calling a coupling routine using a function $f_2$ or respectively $f_3$ and a condition $C_2$ or respectively $C_3$;

the step of determining zones further comprises determining one or more remaining zone according to the already determined one or more zone and the computed frontiers;

the coupling routine called comprises:

--- for each frontier Fi;
    for each point $P_{i,j}$ of said frontier Fi;
        for each of the frontiers Fk different from said frontier Fi;
            for each point $P_{k,l}$ of the frontier Fk;
                compute $y_{i,j,k,l} = f_m (P_{i,j}, P_{k,l})$ where $f_m$ is the function $f_1$, $f_2$ or $f_3$, according to the one or more zone being determined;
            select a particular couple $P_{k,l-1*}$, $P_{k,l*}$ for which $y_{i,j,k,l-1}$ and $y_{i,j,k,l}$
            satisfy the condition $C_m$, where $C_m$ the condition $C_1$, $C_2$ or $C_3$, according to the one or more zone being determined;
            select a particular point $P_{k,l***}$ among said particular couple $P_{k,l-1*}$, $P_{k,l*}$ according to a further condition $C_s$;
            store the couple $P_{i,j}$, $P_{k,l***}$.

--- the step of computing new faces calls, for each determined zone, a face computation routine adapted to the type of said determined zone;

the method further comprises a step of modifying modeled object data faces according to the new faces computed;

the three-dimensional geometrical figure comprises a sphere of radius r touching said face at said point of the tessellated representation of said face;

the three-dimensional geometrical figure comprises two spheres of respective radii rx and rc, tangential at said point of the tessellated representation of said face; and the three-dimensional geometrical figure comprises a cone and wherein, at the step of determining and storing data representative of an intersection of the three-dimensional geometrical figure, said figure is touching said point and is given a specific longitudinal and latitudinal angles.

The invention further concerns a computer program implementing the method of the invention.

Various embodiments of the invention are now discussed, in reference to the drawings.

BRIEF DESCRIPTION OF THE FIGURES

FIGS. 13A-E illustrate coupling steps, in an embodiment;

DETAILED DESCRIPTION OF THE INVENTION

Figure 1:
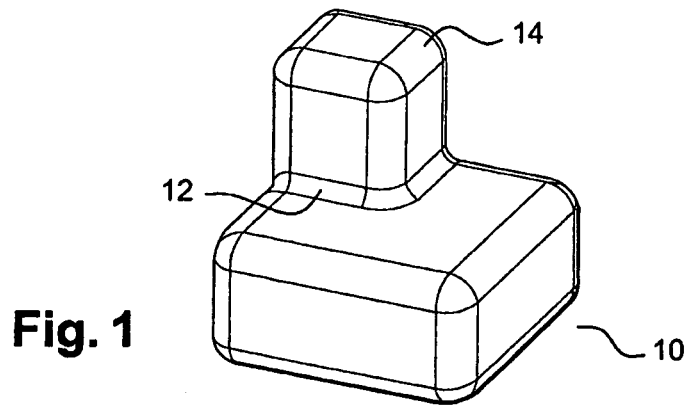
FIG. 1 is an exemplified display of a modeled work body having rounds and fillets.
Figure 2:
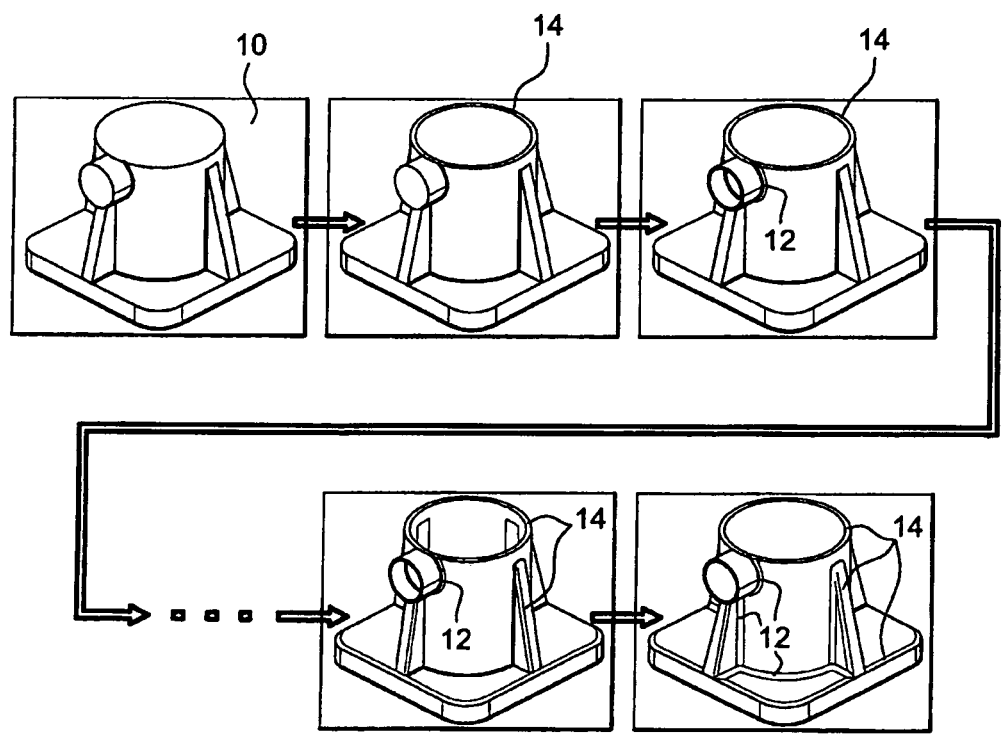
FIG. 2 illustrates a one-by-one round/filet design, according to the prior art.

The invention is directed to a method of computer-aided design of a modeled object having several faces. The method comprises a step of identifying, for each of said faces of the object, at least another of said faces related to said face according to geometrical criteria. Faces are thereby marked as connected. This is part of the "topology preprocessing" needed for implementing subsequent steps of the method. For example, the criteria may relate to the exterior angle of the faces to be identified. The method also comprises a step of computing a plurality of points forming a tessellated representation of each of said faces. Based on this tessellation, the method characterizes critical regions by determining and storing data representative of an intersection between a three-dimensional (3D) geometrical figure (touching a given face) and a face related to said face, according to the identifying step above. The step of determining whether intersections occur is carried out for each point of the tessellated representation of a face and for each face of the object. Preferably, not all faces need be processed, according to user inputs. Then, as part of a "frontier extraction" general step, the method computes frontiers (delimiting zones where surface re-computation would occur) between points according to their respectively stored data and determines zones according to the determined frontiers. Thus, the present approach is a global approach: it is first determined frontiers for the whole body and then determined zones from the frontiers, in contrast with previous approaches where fillets/rounds are locally computed as a portion by portion process. Preferably, a progressive zone determination method is implemented; notably comprising detection of zones comprising at least one edge and having a fillet/round-like, step/wall-like section or showing more complex patterns, by calling a suitable coupling routine. Finally, new faces can be computed according to the determined zones.

Thus, the invention makes it possible to quickly and automatically compute rounds and/or fillet in said zones. All the critical regions are likely to be detected and the determined zone to be processed by the method. As an automated process, it circumvents the difficulty previously due to the order of steps to be "manually" respected. Making use of a method based on the intersection of the 3D figure and adjacent faces allows for providing regular frontiers. The subsequent zone determination is thus made easier. The global approach and progressive features of the method free the model body from being made of a valid closed geometry between each operation, which was previously a major source of failures. As a result, rounding and/or filleting failures are drastically reduced, if not completely circumvented. Therefore, the solution provided by the invention improves the efficiency of product surface fine design and, in particular, the corner rounding and/or filleting process. As an example, implementing the method according to the invention allows computation to last 10% of the traditional filleting task, while providing numerous novel possibilities and user options. It is worth pointing out that CPU time required increases approximately linearly with the number of element to be processed.

The above steps belong to more general steps that can be cast as follows:

"Topology preprocessing", where the work body may be prepared according to faces selected as not-to-fillet faces and/or to be confronted when cracks and slivers management options are selected. The specific faces in question may be regarded as "smooth skins", which will be discussed in details later. Further, fillet convexity between the smooth skins is computed.

"Tessellation." Here, the aim is to convert the body into a polyhedron, as known in the art. However, special attention is drawn to control input parameters, so as to balance the resulting polyhedron fidelity, method accuracy and available hardware resources.

"Frontier extraction." Now, the polyhedron is partitioned into a set of "movable" vertices and a set of "unmovable" vertices, as will be detailed after. Frontiers between the subsets are returned and information for next steps is gathered.

In addition, the method of the invention may possibly comprise the following general steps:

"Exact fillet recognition," where regular fillet/round zones are determined and areas where three faces converge are re-computed.

"Round approximation," where rounded surfaces are created (for either fillet-like fillets or round-like fillets, according to the "Exact fillet recognition"), based on a face-face fillet operator called or possibly a blend operator where fillet operator fails.

"Hard zone management," where corner surfaces are created and a filling operator called. A blend operator may also be called where hard zones are too complex for a filling routine.

"Sewing," where created surfaces are sewed on the final body and unfilleted edges are left unchanged.

Such general steps will be hereafter decomposed as optional sub steps, which may yet advantageously be implemented for carrying out the invention.

In the following, the concepts of "fillet" and "round" are generally encompassed in the wording "fillet", as frequently admitted in the art, unless specified otherwise.

FIGS. 3-7 show a flowchart representing steps of computer-aided design of a modeled object, which will be explained now. As FIGS. 9-14B show typical model body faces obtained at various steps of the above flowchart, references to these figures will be nested in the description of the flowchart of FIGS. 3-7.

Figure 3:
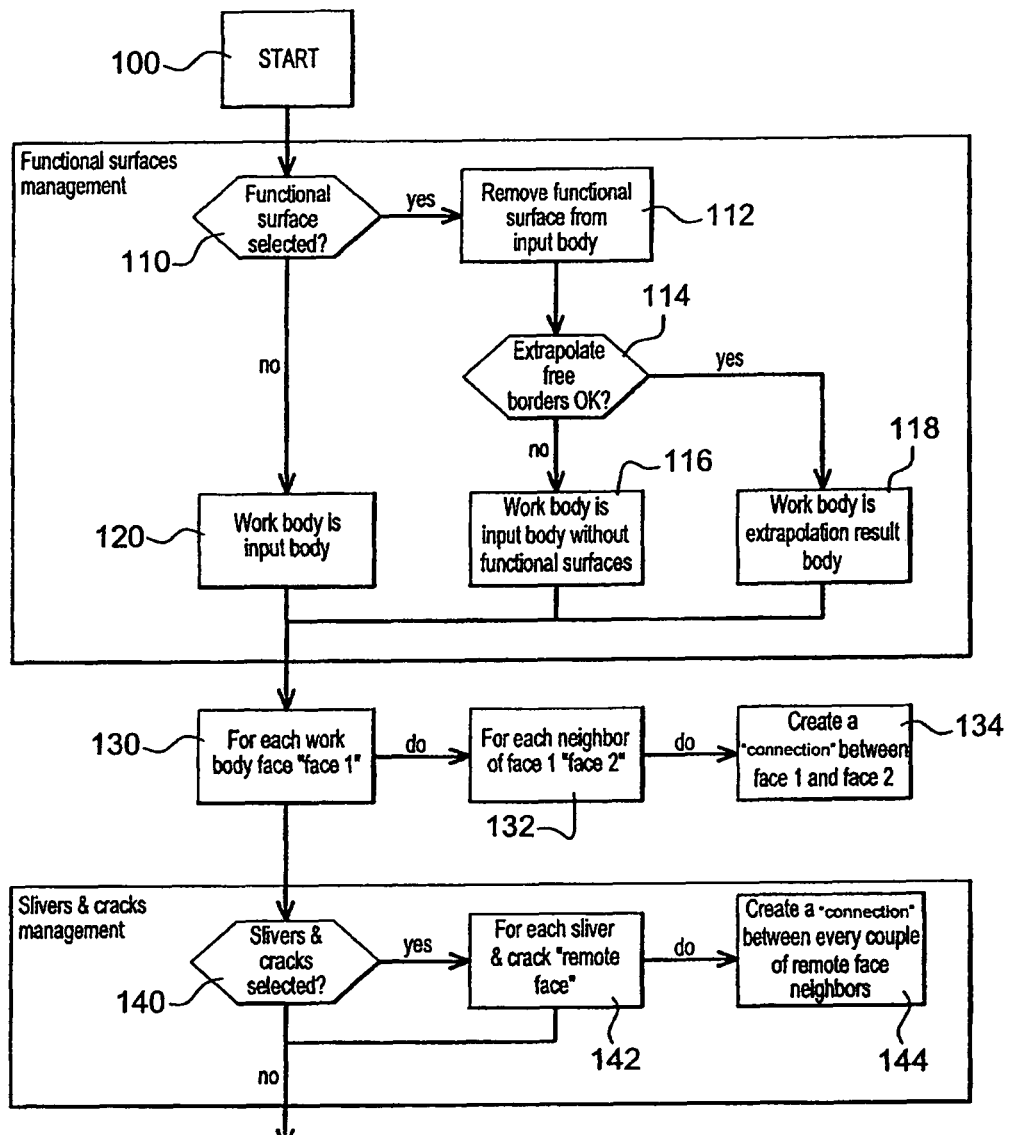
FIGS. 3-7 show a flowchart representing steps of computer-aided design of a modeled object, according to an embodiment of the invention.

FIG. 3 is dedicated to the general step of "Topology preprocessing," itself comprising two main sections, respectively dedicated to the management of "functional" faces (e.g., faces not-to-be processed) and slivers/cracks. In reference to this figure, at step 100, the process is initiated, with respect to a given input body (see e.g., input body 10 of FIG. 9). At step 110, the process may test if a user has pre-selected given faces as not to be processed or allows the user to select such faces. If no face is selected, the body to be processed (work body) remains the same as before (step 120). Else, any selected face is removed from the set of faces to be treated in the input body.

Figures 9A, 9B:
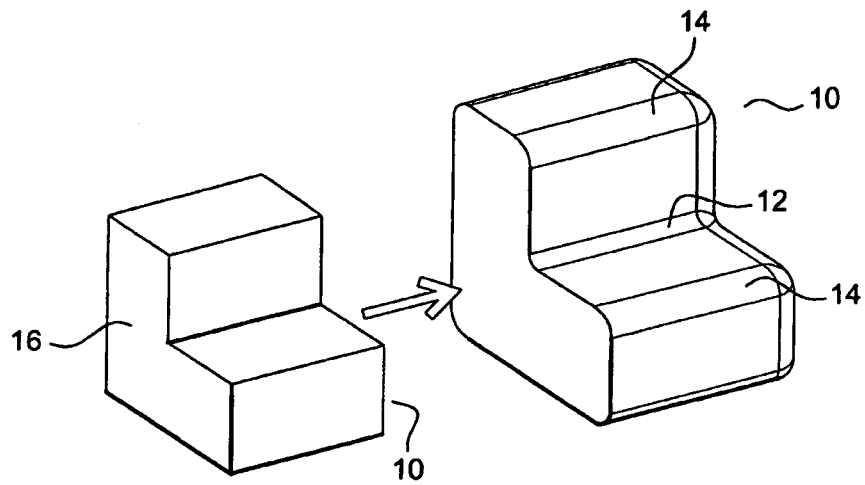
FIGS. 9A-B illustrate schematically an example of design management of a work body, when a face is removed from the faces to be processed.

This is illustrated in FIG. 9a, where the face 16 of the model object 10 is removed from the initial set of face. As a result (FIG. 9b), edges between this face and another face are not re-computed, though they may be etched by computation of other face couples, as to be seen. Removal of specific faces proves advantageous when the user wishes to customize the surface re-computation.

Next, back to FIG. 3, an extrapolation of free borders, e.g., each of the faces contiguous to a face selected as a not-to-be-processed face can possibly be carried out. This turns advantageous in practice, since it has been observed that slightly irregular frontier patterns could be computed at the vicinity of such faces. Hence, it is checked at step 114 whether the extrapolation step was successful. If yes, the work body to be considered will be that with extrapolated faces (step 118). In case of a failure of the extrapolation occurs (for example if extrapolated faces collide with other faces), the extrapolated body is discarded an the work body remains the same as the former input body (step 116), except that the faces selected by the user as not-to-be processed will be discarded, without further considerations (step 120).

In the following steps 130-134, the process creates connections between faces of the body (132-134). In particular, the method identifies, for each of the faces (step 130) of the work body, at least another of body faces related to said face according to geometrical criteria, e.g., faces whose exterior angle is between 180.5° and 360°. The "exterior angle" is the larger angle formed externally in a section transverse to two adjacent faces. When the angle of faces matches the criteria, they are considered to be separated by a sharp edge and faces are marked as connected. In contrast, faces which do not match these criteria are considered as a single continuous face, e.g., a "smooth skin" as known in the art. As a result, two faces belonging to the same smooth skin shall not be confronted in the rest of the process where smooth skins will be confronted.

Figures 10A, 10B, 10C:
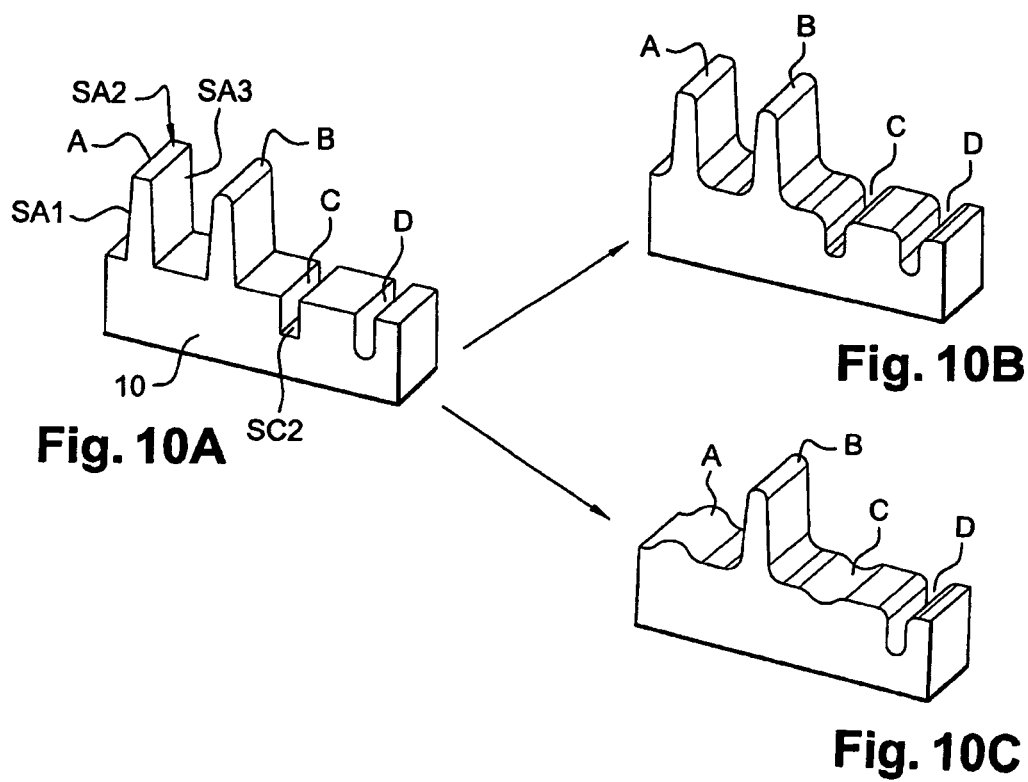
FIGS. 10A-C exemplify the design management of a work body with slivers and cracks.

Optionally, the user may select options dedicated to slivers and crack management (steps 140-144). Slivers and cracks are related to adjacent smooth skins sharing both convex and concave edges. This is exemplified in FIG. 10A, where a sliver of the work body 10 is denoted by reference A and crack is denoted by C. As shown, a sliver typically has a section with a concave/convex/convex/concave sequence, while the opposite stands for cracks. Here, though B and D have respectively a sliver-like and a crack-like section, they will be considered as smooth skins since their critical edges are rounded. The management of B and D will be explained in the next paragraph. If neither sliver nor crack option is selected, the default behavior of the method would lead to the shape as shown in FIG. 10B, that is, sliver/crack A or C ends are slightly rounded but the desired round/fillet radii cannot be reached. In contrast, when selected, such options allow connections between remote faces to be created. For example, face SA2 might be selected, allowing creation of a connection between SA1 and SA3. As a result (FIG. 10C), sliver A has almost collapsed. Conversely, selecting SC2 within a crack management wizard leads crack C to be almost filled. Thus, as regards A or C, the obtained patterns are now consistent with the round/fillet radii.

Further, as to be seen in FIG. 10A-C, rounds preexist on top of sliver B and fillets in the bottom of D. Since such preexisting fillets/rounds suppress singularities in the transverse sections of the respective cracks/slivers, the corresponding faces are seen as single continuous smooth skins. As a result, these faces are not confronted, which allows preexisting fillets/rounds (e.g., with a smaller radius than input fillet/round radii in FIGS. 10A-C) to be preserved, as to be seen when passing from FIG. 10A to FIG. 10C. Incidentally, depending on the implementation of the process, the only fillets allowed with the input body might be design fillets. At the present stage, let us recall that connections have been created between adjacent faces of the body to be processed and that, only the distinct adjacent (and possibly remote) smooth skins are likely be confronted in the following.

Figure 4:
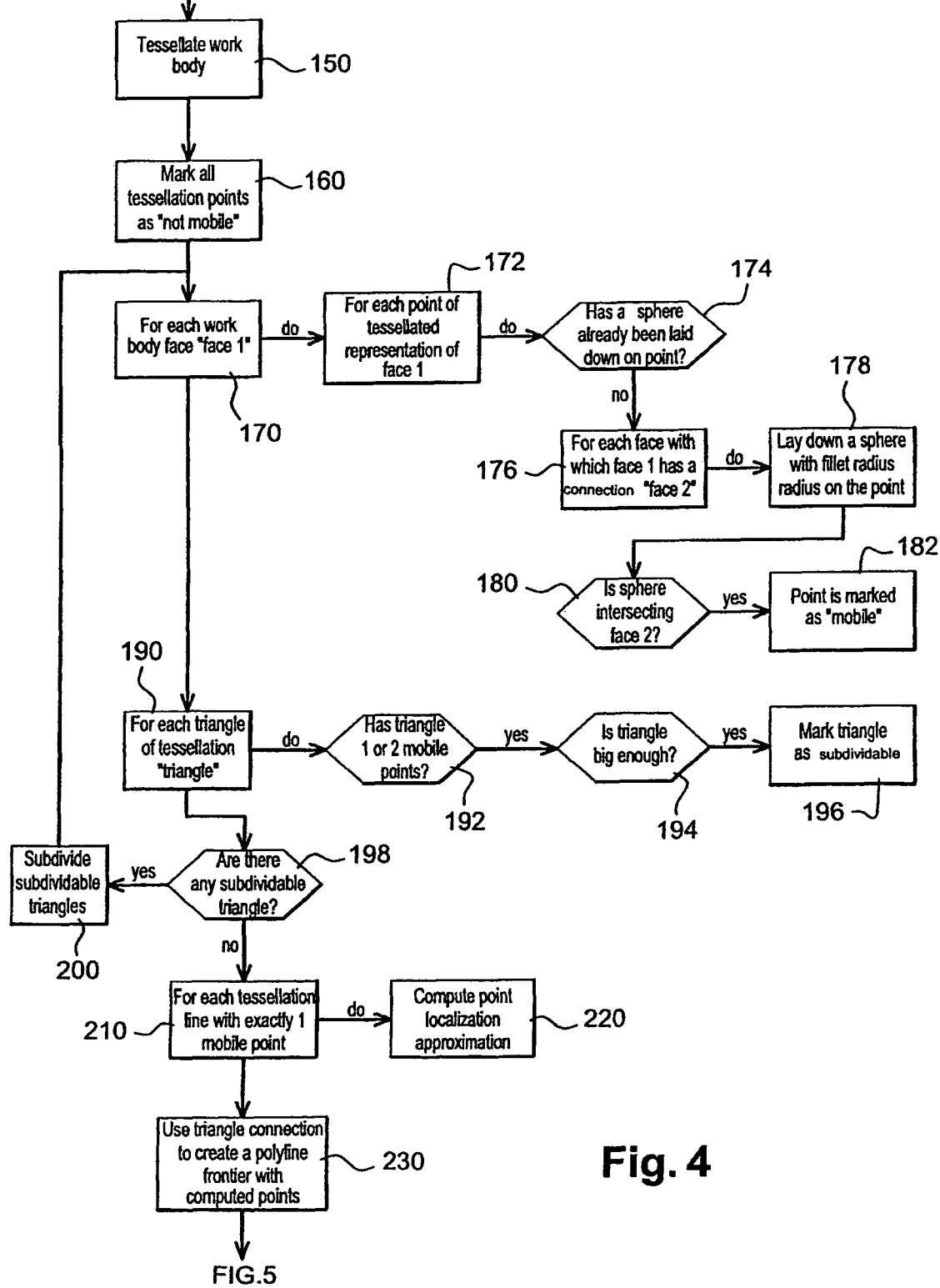

Back to the flowchart, FIG. 4 is continuing FIG. 3 and is generally dedicated to both "Tessellation" and "Frontier extraction" general steps.

In reference to this figure, a plurality of points forming a tessellated representation of each of the body faces is computed at step 150, yielding a tessellated work body. Typically, the tessellated surface consists of an assembly of polygons. These are typically triangles, so that "triangles" will be used hereafter, without loss of generality. Accordingly, each point of the plurality of the points of the tessellated representation is a vertex of a triangle. One may obviously contemplate using the center of each triangle instead of a vertex.

At step 160, in view of data to be stored after, each vertex of the tessellated work body may be given an associated initial default value. For instance, they may be marked as "not mobile", as will become more apparent later.

Next, for each face of the work body (e.g., "face 1" at step 170) and for each vertex of the tessellated representation of said face (step 172), the method determines and stores data representative of an intersection between a 3D geometrical figure touching said vertex and a face identified above as connected to said face (steps 170-182). This turns particularly advantageous, since a radius of the fillet to be computed after can be related to dimensional features of the colliding 3D figure used above, owing to 3D geometrical considerations. In particular, the 3D figure may be either a single or a double sphere touching said face ("face 1") at said vertex of the tessellated representation of said face, tangential to the surface. This will be emphasized in reference to FIG. 11. Accordingly, the 3D figure is hereafter denoted by a "sphere." At step 172, the method tests a particular vertex of face 1. First, it may check whether a sphere has already been laid down at this vertex (step 174). If not, the method may, for each face ("face 2") connected to face 1, lay down a sphere with convenient radius (a default or user-selectable one) at said vertex (steps 176-178). Next, it is tested whether the sphere intersects face 2 (step 180).

Obviously, other schemes may be contemplated for the collision detection, as would be apparent for a skilled person. Data representative of the collision will then be attributed to the tested vertex. For example, said data may restrict to a single binary value, e.g., 1 if a collision is detected, else 0. Alternatively, the data may be representative of the extent of the collision, e.g., based on a portion of the sphere colliding with face 2. Still, said data may consist of a triangle or vertex number corresponding to where a sphere has been found tangential or quasi tangential to another face.

Figure 11:
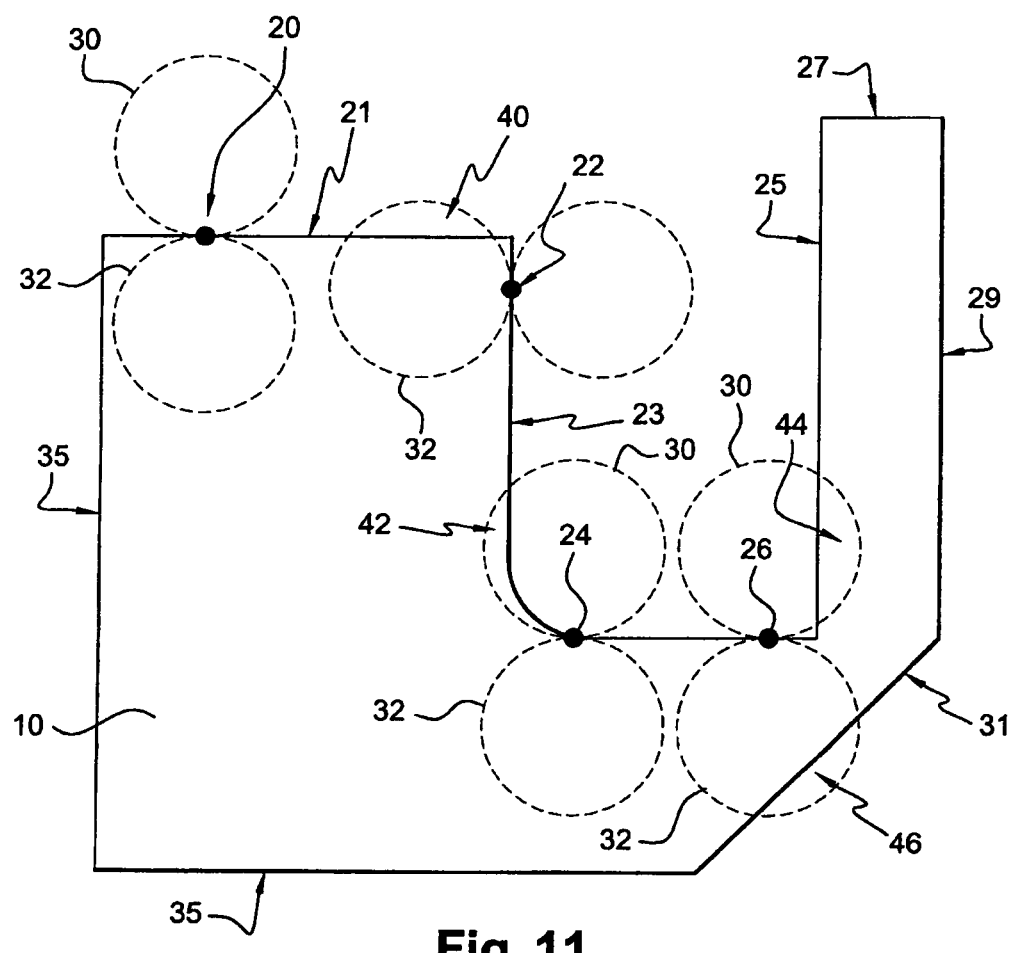
FIG. 11 schematizes intersections between a three-dimensional geometrical figure and work body faces, as part of the method according to an embodiment.

Intersection of the 3D figure with adjacent or remote faces will be better understood in reference to FIG. 11, which shows sections of a given work body 10 and spheres 30, 32 laid down at various vertices 20, 22, 24, 26 of tessellated faces 21, 23, 25, 27, 29, 31, 33 and 35. It is here important to keep in mind that the faces in question may be "smooth skins", that is, faces separated by an edge, whose external angle is more than a given value (e.g., 180.5-360°).

In this example, face 23 is a smooth skin comprising both the vertical wall section (perpendicular and adjacent to face 21) and the contiguous horizontal wall section (perpendicular and adjacent to face 25). Further, only the couples of faces (21-23), (23-25), (25-27), (27-29), (29-31), (31-33), (33-35) and (35-21) are tested (steps 172 and 176 above) in the example of FIG. 11. For clarity reasons, spheres are not represented for all couples of faces on FIG. 11.

Notice that the sphere may be either external 30 to the object (for detecting concave-type collision about concave edges) or internal 32 (for detecting convex type collision), tangential to the body face, at the tested vertex (see for instance sphere 30, 32 about vertex 20).

Thus, only one sphere of a given type may be tested at a time and two loops required for testing both types above (external or internal) or, alternatively, two spheres may be tested at a time in a single loop.

In an alternate embodiment, also encompassed in FIG. 11, the 3D figure may comprise two spheres 30, 32 of respective radii rx and rc, tangential to the face at said vertex.

In fact, the skilled person may understood that only one sphere can be used, the type of which may be known after the step of identifying related faces, once the fillet convexity between adjacent faces has been computed. Thus, depending on the computed convexity of the connected faces (face 1 and 2) tested for collision, the method may be adapted for choosing the convenient sphere (internal or external) at a given point and subsequently test it. As an example, consider the edge between faces 21 and 23, which might be seen as a convex edge. Once the convexity of this edge is known, it is obvious that use of an external sphere is of no interest, since the latter could not give rise to any collision between the sphere and one or the other of the faces 21, 23 about the edge. Instead, making use of an internal sphere allows for a sphere-face collision 40, as shown. Since the collision 40 is about a convex edge, it is convenient to call it "a convex collision" 40. Thus, data may be stored, associated to the vertex 22, representative of the collision. Notice that the shape of the 3D figure (here the radius of the sphere) determines the radii of fillets/round to be computed later. Thus, the 3D geometrical figure provides an objective tool for determining regular frontiers, about which surface re-computation should take place.

Next, regarding concave edges, symmetrical arguments lead one to conclude that intersections denoted by arrows 42 and 44 are "concave" collisions, this time caused by the external sphere 30. However, owing to the embodiments discussed above, the intersection 42 is not marked as colliding in this example, since it occurs where two faces belong to the same smooth skin 23. Similarly, intersection 46 is here not scheduled as a convex collision since faces 23 and 31 are not adjacent faces. Finally, only the collisions 40 and 44 are considered as effective collisions in the example of smooth skin 23. Accordingly, data representative of the corresponding intersection is stored, associated to the respective vertices 22 and 26. Such a data may for instance consist of a value denoting a vertex marked as mobile (see step 182), in which case the vertex is likely to be removed at subsequent steps. Alternatively, said value may vary continuously according to the extent of collision, e.g., proportional the height of the colliding segment of the sphere, etc.

Having this in mind, one may briefly revert to FIG. 10, concerning slivers and crack management. As said, the default method allows only the adjacent smooth skins to be confronted. In contrast, selecting convenient options for slivers/cracks management allows non adjacent smooth skins to be confronted. Thus, in view of the description of steps 170-180 above, when a user selects a sliver/crack, it is tested whether the 3D figure laid down at a face about the sliver/crack selected intersects a remote face, beyond an adjacent one. For example, selecting a sliver/crack allows locally second-neighbor faces to be tested, possibly third-neighbor. For example, if smooth skin SA2 is selected in FIG. 10A, then faces (SA1,SA3) will be confronted, in addition to (SA1, SA2) and (SA2,SA3), e.g., the default confrontation. If smooth skin SA2 is not selected (thus if A is not considered as a sliver to be kept), only (SA1,SA2) and (SA2,SA3) are tested, leading to the pattern of FIG. 10B.

Now, referring back to the flowchart, FIG. 4, the next set of steps 190-230 are dedicated to the computation of frontiers between vertices, according to their respectively stored data. A frontier may for example be computed between vertices whose stored data are respectively representative of a collision and no collision (this appears convenient as round/fillet radii are related to the dimensions of the test sphere). Thus, frontier points are determined on segments linking vertices with stored data indicative of an intersection and of no intersection, respectively.

Accordingly, at step 190, a loop begins for each tessellation triangle; it is then tested (step 192) whether said triangle has one or two vertex (vertices) marked as mobile at step 182. If yes, it is for example tested if the area of said triangle is greater than a threshold area (at step 194), leading to a triangle marked as "sub dividable." Though optional, such a possibility is advantageous as it allows for a finer frontier computation between vertices with opposite collision status. If sub dividable triangle are found (step 198), there are accordingly subdivided (200), yielding new vertices which are again tested with respect to collision by beginning a new loop (step 170). The loop of step 170 occurs until no more sub dividable triangle is found (step 198).

Next, a new loop begins at step 210, whereby point positions can be computed according to an approximation (step 220). In particular, storing data representative of an amount of the collision, for instance based on a colliding portion of the colliding sphere, allow the theoretical positions of the points to be computed. A "polyline" frontier can thus be determined according to said computed points.

Figure 12A:
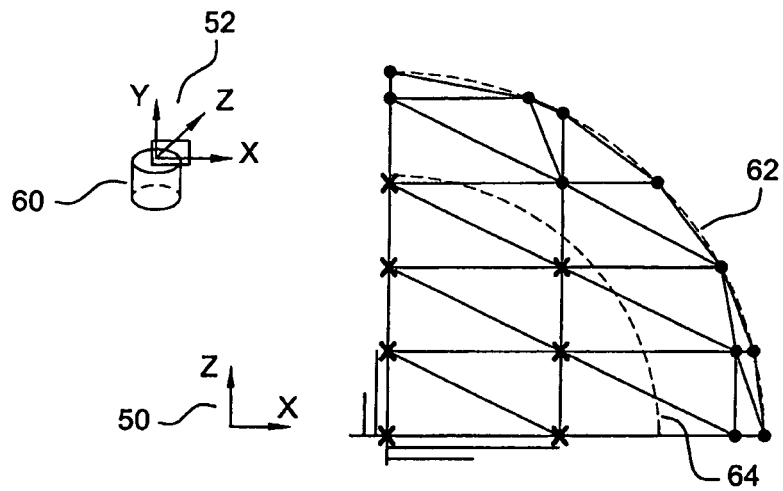
FIGS. 12A-C diagrams extraction of frontiers, in an embodiment.
Figure 12B:
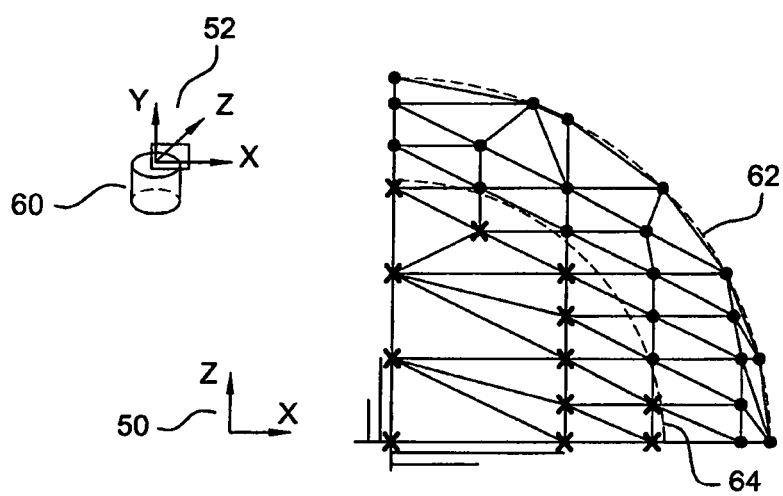

The above frontier computation is exemplified in FIGS. 12A-12B, schematizing successive stages of frontier computation, according to the above embodiment.

Figure 12C:
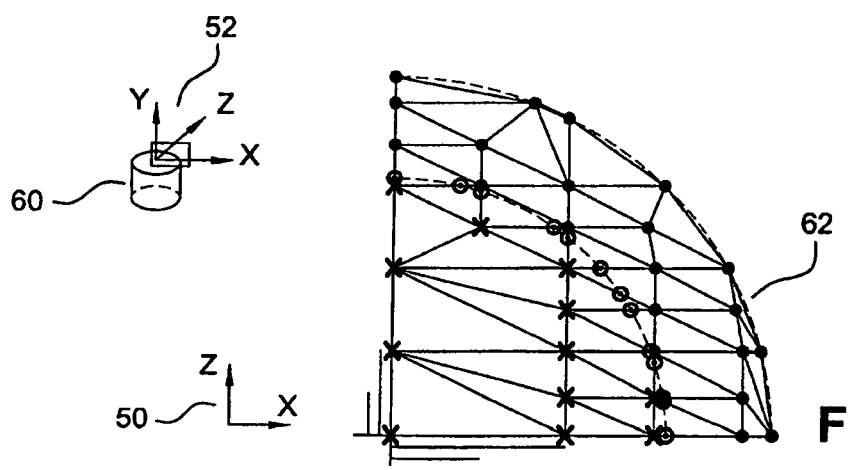

The example chosen is that of a cylinder 60 oriented according to the Cartesian coordinate system mark 52 shown just above the cylinder 60 in the left part of FIGS. 12A-C. The main part of the figures shows an enlarged schematic quadrant section 62 of the cylinder oriented according to plane (x,z), as denoted by mark 50. Otherwise put, it is viewed from above. Said cylinder section 62 comprises a number of vertices either marked as "mobile" or "not mobile", according to the embodiment described above. Vertices marked as "mobile" are represented as single points while crosses denote vertices which are not mobile. The dotted line 64 represents a (yet) theoretical frontier.

FIG. 12A represents said quadrant section 62 as to would be obtained after step 182: triangles contain 0, 1, 2 or 3 mobiles vertices.

FIG. 12B shows a situation generated by steps 190-200 described above, that is, triangles with exactly one or two mobile vertices are sub divided, whereby new vertices appear about the theoretical frontier 64.

Next, FIG. 12C illustrates a result of carrying out steps 210-230, whereby a "polyline" frontier is provided, according to specifically computed points (step 220), here shown as circled points. Accordingly, implementation of the above steps allows for a refined frontier extraction.

Figure 5:
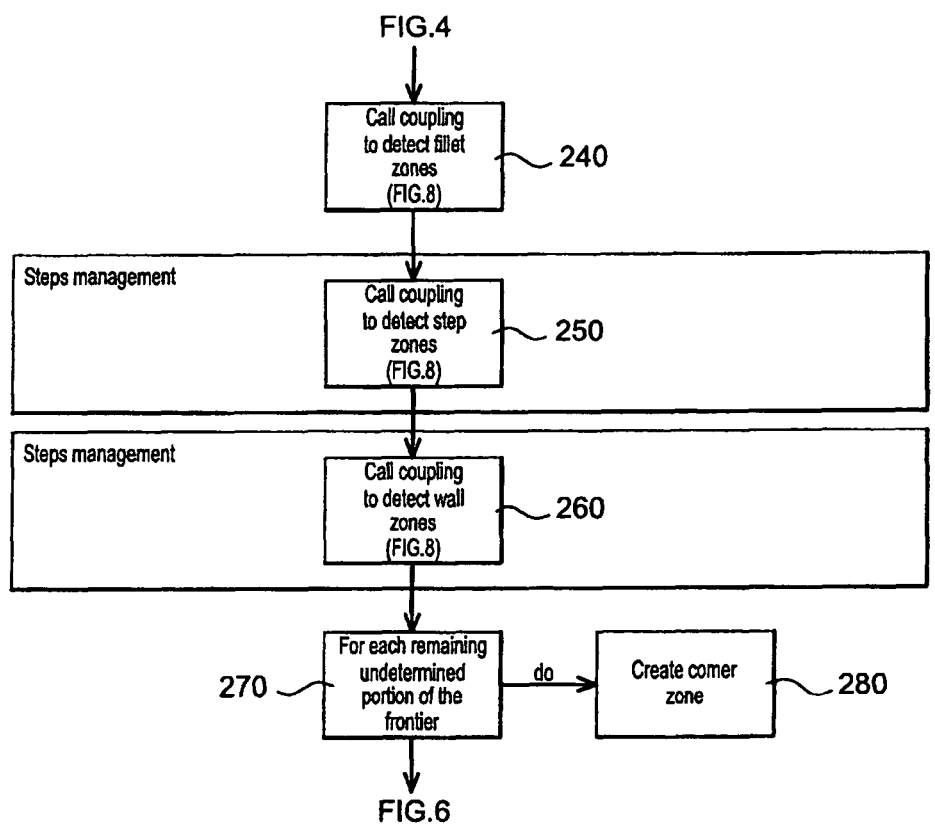
Figure 6:
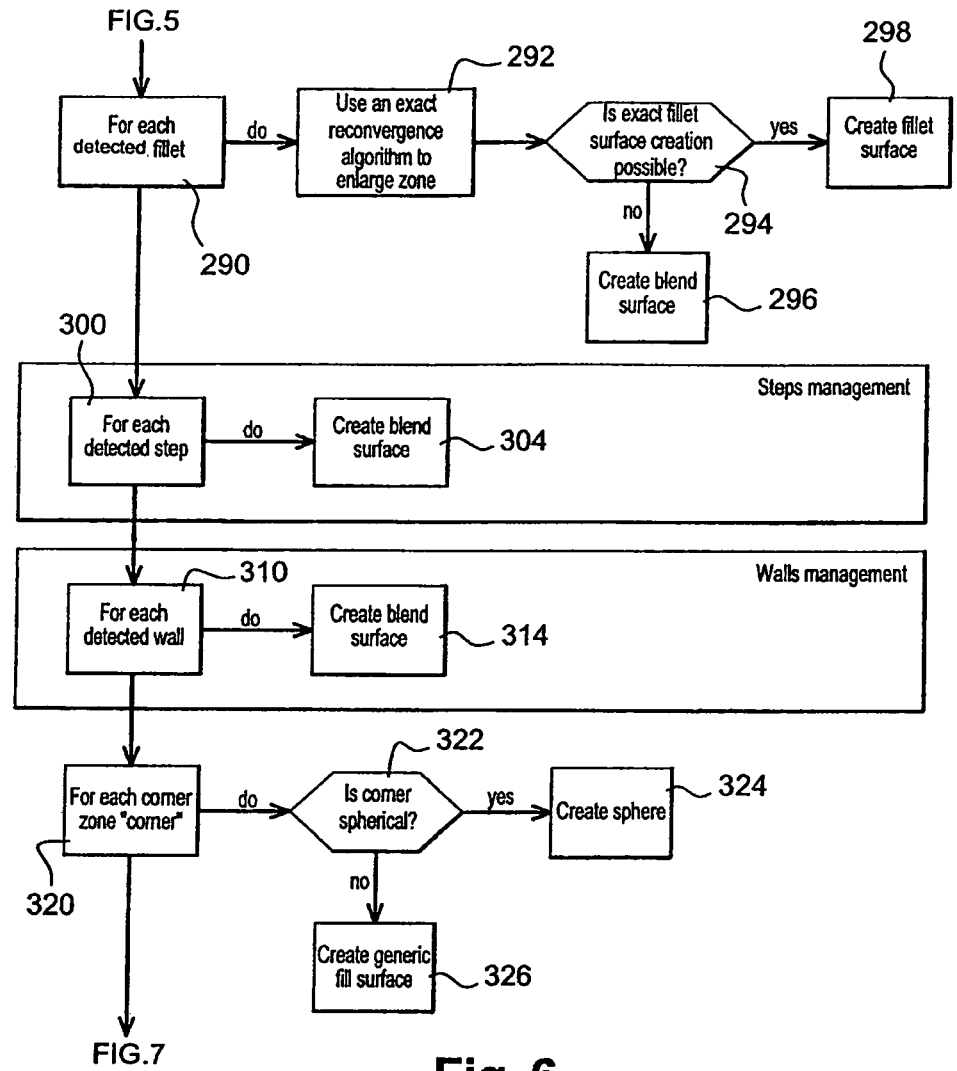

Referring back to the method, FIGS. 5 and 6 are dedicated to general steps of "Exact fillet recognition", "Round approximation" and "Hard zone management."

Back to the flowchart, in reference to FIG. 5, a coupling routine is called each times it is needed to determine zones having a fillet- or round-like section (step 240), a step-like section (step 250) or a wall-like section (260). Though different routines can be called, these have at least a set of common features which will be detailed in reference to FIG. 8.

Exact fillets are returned after the routine has first been called. Using the above routine (or successively similar routines) proves advantageous as above section patterns are commonly observed on usual work bodies to be processed. Preferably, the coupling routine is first called for determining round/fillet zones and then for wall/step zone determination, in any order. Thus, exact fillets are searched wherever possible and then the wall/step zones are searched. The above routine will be detailed in reference to the chart of FIG. 8.

Since hard zones reside where fillet/wall/step zones are not found, they are preferably managed afterwards. It may then be determined one or more remaining zone (step 270) according to the computed frontiers, for which a specific corner zone is created at 280.

Next, referring to FIG. 6, a new loop begins at step 290. For each fillet detected (cf. step 240), an exact re-convergence method is used, for example based on Newton-Raphson methods or the like, so as to "enlarge" the zone to be processed (step 292). Then, an exact fillet surface is created whenever possible (steps 294-298), by calling a face-face fillet operator. Else, a blend operator is called (step 296).

In contrast, concerning step/wall zones detected via the coupling method (steps 250 and 260 above), the blend operator is directly called (steps 300 and 310), whereby blend surfaces are created (at steps 304 and 314).

Regarding now the corner zone created at 280, the method proceeds as follows: it is first tested if the corner is spherical, in which case a sphere is created (steps 320-324), else a classic fill surface is generated (step 326), as known in the art.

Some comments are in order. Concerning the blend operator used at steps 296, 304 and 314: the following steps are taken: frontier polylines are approximated by 3D curves and, then, the 3D curves are projected on the input body, yielding 2D curves. Then, a blend operator is called, using as inputs the created 2D curves and the involved support faces.

Concerning now the fill operator used at step 326, a similar 3D to 2D projection occurs. The fill operator (operators as such are known in the art) is then called, using the created 2D curve, in addition to the borders of the previously generated fillet surfaces (cf. step 298) or blend surfaces (cf. steps 296, 304 or 314), so as to create a smooth surface.

If hard zones are too complex for use of a filling method, a hard zone may possibly be subdivided, before calling a blend or a fill operator, depending on the features of the local geometry.

In addition, suitable operators can be called so as to provide surface curvature control.

Figure 7:
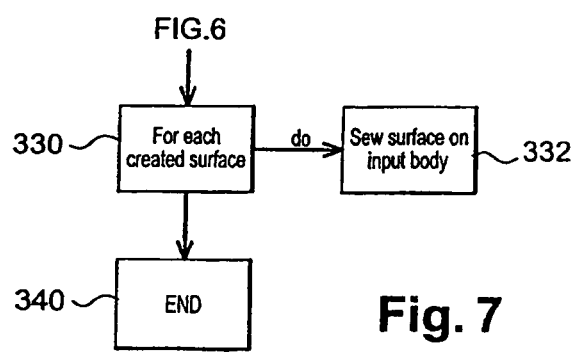

Finally, referring to FIG. 7, dedicated to the final sewing general step, a loop is initiated at step 330, triggering a sewing routine (332) for each previously created surface. Notice that depending on sewing strategy, more than one surface can be sewn at the same time on the input body.

The method stops at 340.

Figure 8:
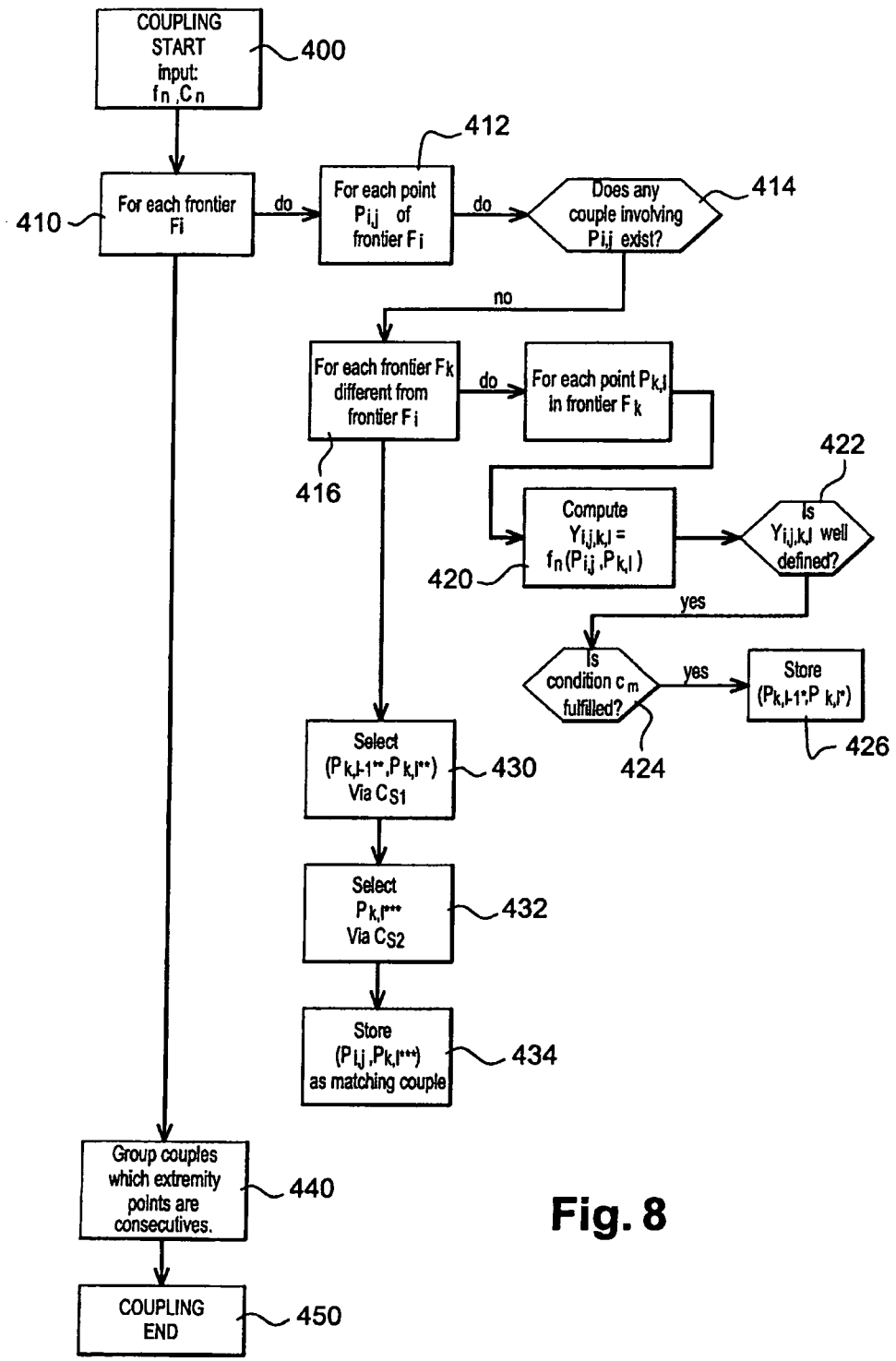
FIG. 8 is a flowchart representing steps of a coupling routine called in FIG. 5.

Referring now to FIG. 8, the coupling routine called at steps 240, 250 and 260 in FIG. 5 is described in details.

For each computed frontier Fi (step 410) and for each point $P_{i,j}$ (step 412) of said frontier Fi, it might first be tested (step 414) if point $P_{i,j}$ is already involved in any couple previously determined, in which case no further coupling is tried for this point. Else, for each of the frontiers Fk different from said frontier Fi (step 416) and for each point $P_{k,l}$ (step 418) of the frontier Fk, it is computed at steps 420-422 the value $y_{i,j,k,l} = f_m(P_{i,j}, P_{k,l})$, where the function used $f_m$ depends on the type of current trial coupling. For example, a first function $f_1$ may be used when the routine is called from step 240 (for fillet zone detection), $f_2$ when called from step 250 (step zone detection) or $f_3$ (wall zone detection).

Preferably then, it is tested whether computed $y_{i,j,k,l}$'s fulfills some "admissibility" conditions (step 422). First, based notably on the respective normal to $P_{i,j}$, $P_{k,l}$, it is determined whether the current couple being considered belongs to a fillet, round, step or wall zone, whereby it may possibly be retained as a candidate, else it is rejected. Further, as an example of additional admissibility conditions for step-like sections, points about a step with height greater than twice the average round/fillet radius are discarded as possible candidate for coupling, owing to obvious geometrical reasons. Similar admissibility conditions are used for either type of zone. In addition, said admissibility conditions could be computed before calculating $y_{i,j,k,l}$'s.

Then, it is stored (step 426) one or more particular couple $(P_{k,l-1}^{*}, P_{k,l}^{*})$ for which the respectively computed $y_{i,j,k,l-1}$ and $y_{i,j,k,l}$ (steps 420-426) satisfy a condition $C_m$ (for example a sign change at step 424, as will be described later), where $C_m$ depends on the current trial coupling, as for $f_m$'s. Conditions $C_1$, $C_2$ or $C_3$ are used at steps 240, 250 and 260, respectively.

In case if several couples $(P_{k,l-1}^{*}, P_{k,l}^{*})$ have been found to fulfill condition $C_m$ at step 426, it might first be selected a more particular couple $(P_{k,l-1}^{}, P_{k,l}^{})$ (step 430), according to some further condition Cs1. Then, choose a more particular point $P_{k,l}^{*}$ would be chosen (e.g., $l^{*}=l-1^{}$ or $l^{}$) according to a further condition $C_{s2}$ (steps 430-432). Notice that the routine may work fine even if $C_{s1}$ and $C_{s2}$ are reduced to a single arbitrary choice, provided than the step between couples of points $(P_{k,l-1}, P_{k,l})$ is sufficiently small.

Otherwise put, the point $P_{k,l}^{***}$ finally selected may be regarded as the one obtained upon fulfilling the condition $C_s$ (in addition to the previous condition $C_m$), where $C_s$ comprises both $C_{s1}$ and $C_{s2}$ (especially when several couples $(P_{k,l-1}^{*}, P_{k,l}^{*})$ are to be found).

Finally, the couple $P_{i,j}$, $P_{k,l}^{*}$ is stored at 434**.

Next, when loop started at step 410 ends, couples of points with consecutive extremity points (e.g., those forming the couples) are identified (step 440) and marked as belonging to a same group, so that portions of frontiers are paired, thereby forming zones.

The routine ends at 450.

Obviously, not all the couples of frontiers Fi, Fk as well as couples of points $(P_{i,j}, P_{k,l})$ need be considered in the above routine. Rather, it is preferable to restrict the computation of $y_{i,j,k,l}$'s according to further conditions, chosen so as to discard couples which have no chance of being coupled in fine, for example owing to distance criteria.

Implementing the above method in the coupling routine makes it possible to automatically recover "exact" fillets, step and wall zones.

In the following, functions $f_m$ and conditions $C_m$ used when calling the coupling method of FIG. 8 are discussed in relation to FIGS. 13A-D.

FIGS. 13A-D show a work body 10 having edges 70 and frontiers $F_i$ (as determined from step 230). In particular, the work body shows a step-like section 72, a wall-like section 74 and "hard" zones (here corners) 76.

As an example, FIGS. 13A-C illustrate specific function $f_1$ and condition $C_1$ used in the coupling routine (cf. steps 410-450 of FIG. 8) for exact fillet recognition, that is, when called from step 240. Notice that only two frontiers $F_1$ and $F_2$ are shown, for clarity.

Let us first explain the theoretical result to be achieved, in this specific embodiment. To this aim, consider a given point $P_{1,1}$ of a frontier $F_1$ and a "convex" (internal) sphere 111 about said point $P_{1,1}$, tangential to the face comprising frontier $F_1$ at this point. For all distinct frontiers (in this case: $F_2$), it is searched a candidate point $P_{2,l-1}$, $P_{2,l}$, etc., for coupling, having approximately the same convex sphere associated. For example, FIG. 13A, a convex sphere 121 is laid down, tangential to point $P_{2,1}$. As spheres 111 and 121 are not well matching within a given tolerance, point $P_{2,1}$ is to be discarded as a possible candidate for coupling. In contrast, FIG. 13B, sphere 121' laid down at point $P_{2,1'}$ yields a sphere substantially matching sphere 111 (differences are not visible at the scale of FIG. 13B). Thus, the point 104 could be retained as a possible candidate for coupling.

Now, to achieve this, a possible practical implementation is the following, explained in reference to FIG. 13C. For a given point $P_{1,1}$ of $F_1$, it is computed the value $y_{1,1,2,l}=f_1(P_{1,1}, P_{2,l})$, for each point $P_{2,l}(l=1, 2, 3, \ldots)$, (for examples $P_{2,1}$ and $P_{2,2}$) of frontier $F_2$, as explained above. One may choose the function $f_1$ as the scalar product:

$$f_1(P_{i,j}, P_{k,l}) = (c_{k,l} - c_{i,j}) \cdot (n_{i,j} - n_{k,l})$$

where $n_{i,j}$ is the vector normal to the face at point $P_{i,j}$ and $c_{i,j}$ is the vector pointing at the center of the sphere (1ij=111, 121, 122 in FIG. 13C) tangential to $P_{i,j}$. Notice that such vectors are entirely defined from knowledge of position of $P_{i,j}$. In particular, $n_{i,j}$ derives from the gradient of the face, computed at $P_{i,j}$. Thus, remarking that $f_1(P_{i,j}, P_{k,l})$ is exactly zero at the theoretically matching point $P_{k,matching}$, one may choose the condition $C_1$ as:

$$\text{Sign}(f_1(P_{i,j}, P_{k,l-1})) \neq \text{Sign}(f_1(P_{i,j}, P_{k,l})).$$

In FIG. 13C, the points $P_{2,1}$ and $P_{2,2}$ fulfill said condition $C_1$, with respect to $P_{1,1}$. Thus, according to step 428 above, this particular couple $(P_{2,1}, P_{2,2})$ is stored. Similar operations are carried out for each point $P_{1,j}$ of frontier $F_1$. Preferably, points already involved in a couple are not recomputed and only neighboring frontiers $F_k$ are tested. Similar operations are performed with concave sphere.

Figure 13D:
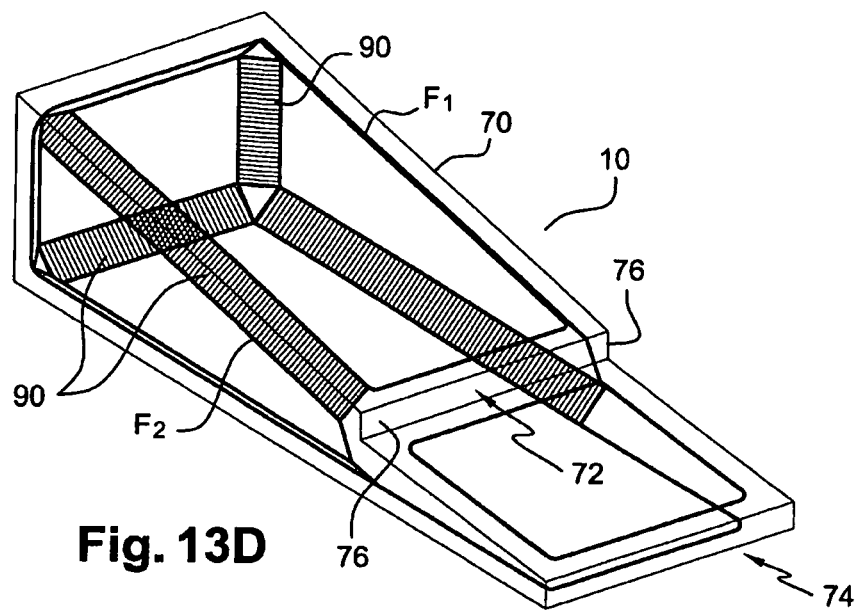

Upon completion of the coupling routine after step 240, the situation is that schematically illustrated in FIG. 13D. Exact fillets are denoted by reference 90. As to be seen in this figure, exact fillet have not been created about the step zone 72, the wall zone 74 and "hard" zones 76, as no exact (sphere-based) coupling was possible in such zones).

Concerning now the step and wall zones, one may choose the function $f_2 = f_3$ as:

$$f_{2/3}(P_{i,j}, P_{k,l}) = (P_{k,l} - P_{i,j}) \cdot (\tau_{k,l} - \tau_{i,j})$$

where $\tau_{i,j}$ is the vector tangential to the face considered, along the frontier line $F_i$, at point $P_{i,j}$ ($\tau_{i,j}$ and $\tau_{k,l}$ are chosen with opposite directions). As before, $\tau_{i,j}$ and $\tau_{k,l}$ is known from $P_{i,j}$ and $P_{k,l}$, so that the dependence on $P_{i,j}$ and $P_{k,l}$ is implicit. A convenient condition $C_{2/3}$ in that case is:

$$\text{Sign}(f_{2/3}(P_{i,j}, P_{k,l-1})) \neq \text{Sign}(f_{2/3}(P_{i,j}, P_{k,l})),$$

as in the above case.

Figure 13E:
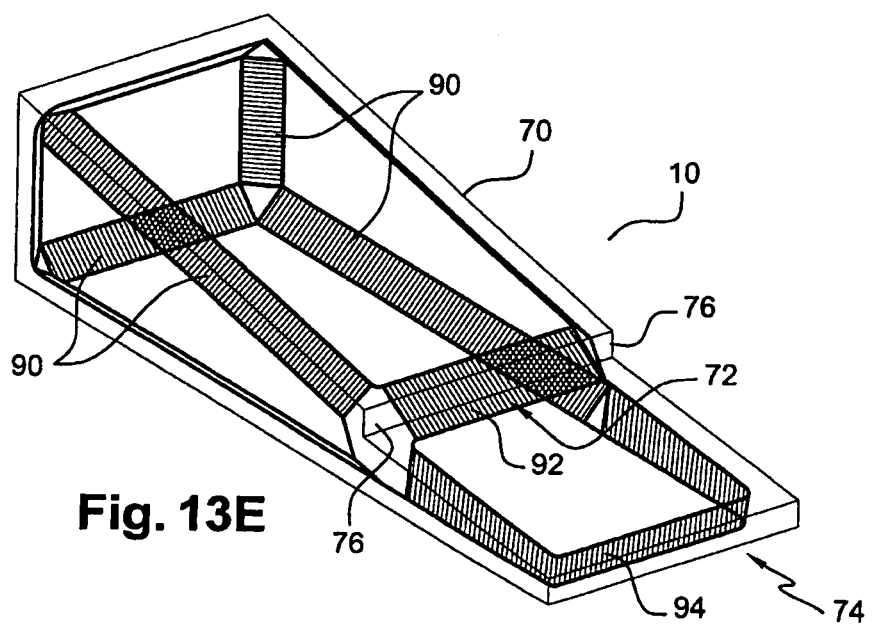

Though $f_2 = f_3$ and $C_2 = C_3$, the geometry inherent to steps and walls leads to couplings different in nature, as illustrated in FIG. 13E. Upon completion of the coupling routine after steps 250 and 260, the situation is that illustrated in FIG. 13E: step zone 92 and wall zone 94 are coupled.

Yet, hard zones 76 remain, for which a specific treatment is to be carried out (cf. steps 320-326 above).

Figure 14A:
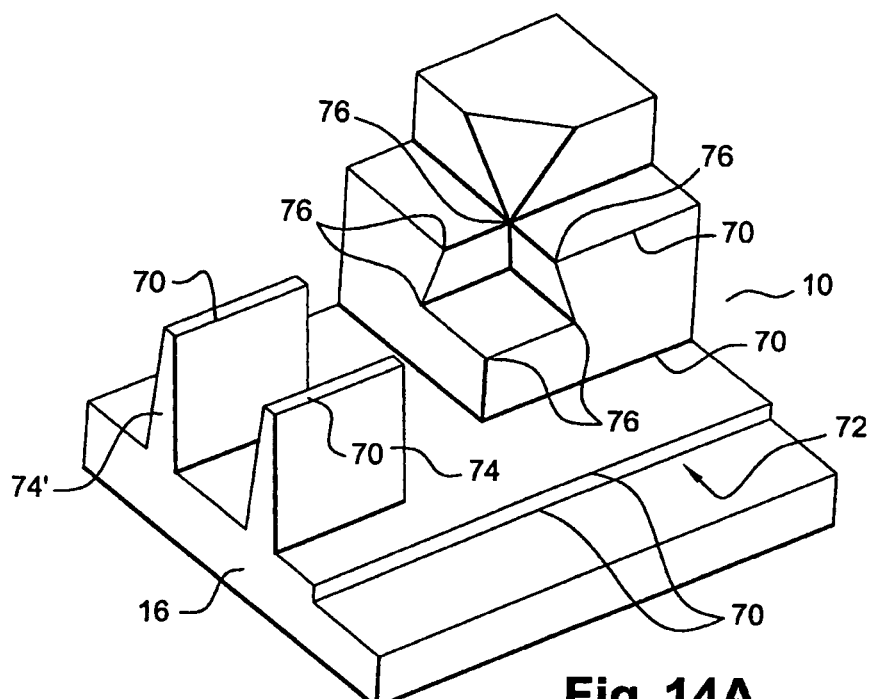
FIGS. 14A-B exemplify a design management of a work body having various edge portions.
Figure 14B:
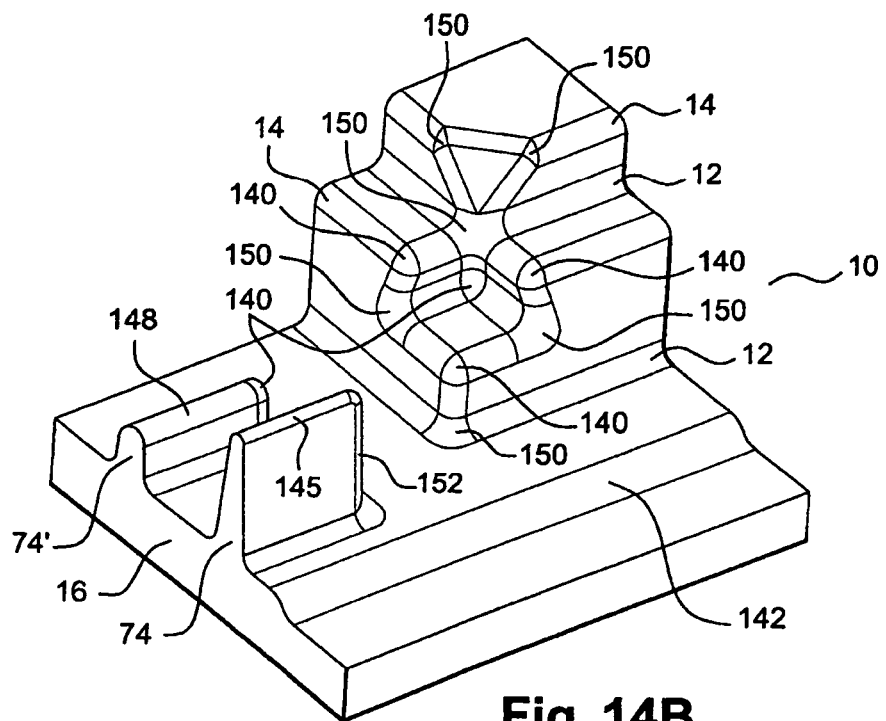

As a pedagogical example of results that can be achieved thanks to the present invention, FIGS. 14A-B illustrate a result of the management of a work body 10 presenting various edge portions. Sharp edges 70 delimit various faces. References 72, 74 and 76 respectively denote step, wall and corner zones. In this example, the face 16 is specifically selected as a not-to-fillet face and a sliver option is selected for the wall-like section 74'.

Implementing the method described above results in a modified work body as illustrated in FIG. 14B (dimensions are conveniently chosen so as to emphasize modifications). In particular, fillet zones 12 and round zones 14 are provided, which benefited from an "exact coupling" surface recomputation, according to the terminology used above. In addition, step and wall zones (142 and 145, respectively) have benefited from a blend-operator (see also 152 where blend operator has been called), whereas some of the corner zones 140 have been approximated by a portion of a sphere surface and harder corner zones have been filled 150, thanks to the fill operator discussed above.

The wall-like section 74' selected as a sliver has also benefited from an exact fillet surface recomputation 148 ("exact-coupling"), whereby remote faces were tested through colliding spheres. Thus, as can be seen, the round radius in 148 is the same as that used for rounds 14. Also, the selected face 16 has not been processed, though it is partly etched due to surface recomputation of adjacent faces.

The modified surfaces have been afterwards sewn on the input body 10.

The invention is not limited to the preferred embodiments described in reference to the drawings. Notably, the invention concerns a computer program implementing the method according to the invention.

Further, the three-dimensional geometrical figure used may comprise various geometrical shapes, depending on the desired application. For example, it may comprise a cone or a portion thereof. Thus, according to the method of the invention, at the step of determining and storing data representative of an intersection of the three-dimensional figure, said cone can be laid down one the face, tangential to the face and touching the point of the tessellation being currently tested for collision of the cone. The cone can be given specific longitudinal and latitudinal angles, where said angles relate to the usual theta and phi angles in spherical coordinates, taking for instance r along the cone main axis. These angles can further be user-selectable. Thereby draft patterns can be obtained on the work body. In addition, many of the above mentioned advantages are provided, as long as employing a cone is compatible with the specific discussed features.

Also, although the method and routines described herein above are described in a naïve manner, it is obvious that improvements can be contemplated with respect to algorithm efficiency considerations.

The invention claimed is:

1. A method for designing a modeled object having several faces, the method being implemented with a computer system comprising at least one computer processor, said method comprising the steps of:

identifying, using said at least one computer processor, for each of said faces, at least another of said faces related to said face according to geometrical criteria;

computing, using said at least one computer processor, a plurality of points forming a tessellated representation of each of said faces; wherein for each of said faces;

for each point of the tessellated representation of said face;

determining, using said at least one computer processor, and storing data representative of an intersection between a three-dimensional geometrical figure extrinsic to said modeled object and touching said point and another face identified as a face related to said face;

computing, using said at least one computer processor, frontiers between points according to their respectively stored data;

determining, using said at least one computer processor, zones according to the computed frontiers; and computing, using said at least one computer processor, new faces according to the determined zones.

2. The method of claim 1, wherein each point of the plurality of points forming the computed tessellated representation is a vertex of a tessellation polygon.

3. The method of claim 1, wherein each point of the plurality of points forming the computed tessellated representation is a vertex of a tessellation polygon; the method of claim 2, wherein the step of computing frontiers comprises determining, using said at least one computer processor, frontier points on a segment linking vertices with stored data indicative of an intersection and of no intersection, respectively.

4. The method of claim 3, wherein the step of computing frontiers comprises, prior to computing the frontier point, subdividing, using said at least one computer processor, polygons having vertices with stored data indicative of an intersection and of no intersection, respectively.

5. The method of claim 1, wherein said data is representative of an amount of the intersection between said figure and said another face.

6. The method of claim 1, further comprising a step of user selection of a face not to be processed and subsequent removal of this face from the faces to be processed.

7. The method of claim 5, further comprising a step of extrapolating, using said at least one computer processor, faces adjacent to the face removed.

8. The method of claim 1, wherein the geometrical criteria comprises at least: the exterior angle of the faces to be identified as related faces is between 180.5° and 360°.

9. The method of claim 1, wherein the step of determining and storing data representative of an intersection is further carried out for each couple of faces related via a face selected by a user.

10. The method of claim 1, wherein the step of determining zones comprises:
determining, using said at least one computer processor, one or more zones comprising an edge and having a fillet-like or round-like section, by calling a coupling routine using a function $f_1$ and a condition $C_1$.

11. The method of claim 1, wherein the step of determining zones comprises:
determining, using said at least one computer processor, one or more zones comprising two edges with a minimal distance less than a dimension related to the three dimensional object and having a step-like section, by calling a coupling routine using a function $f_2$ and a condition $C_2$.

12. The method of claim 1, wherein the step of determining zones comprises:
determining, using said at least one computer processor, one or more zones comprising two substantially parallel face portions separated by at least two edges with a minimal distance less than a dimension related to the three dimensional object and having a wall-like section, by calling a coupling routine using a function $f_3$ and a condition $C_3$.

13. The method of claim 1, wherein the step of determining zones comprises:
determining, using said at least one computer processor, one or more zones comprising an edge and having a fillet-like or round-like section, by calling a coupling routine using a function $f_1$ and a condition $C_1$; and
determining, using said at least one computer processor, one or more zones comprising two edges with a minimal distance less than a dimension related to the three dimensional object and having a step-like section or respectively a wall-like section, by calling a coupling routine using a function $f_2$, or respectively $f_3$ and a condition $C_2$ or respectively $C_3$.

14. The method of claim 1, wherein the step of determining zones further comprises:
determining, using said at least one computer processor, one or more remaining zones according to the already determined one or more zones and the computed frontiers.

15. The method of claim 10, wherein the coupling routine called comprises:
for a first frontier Fi;
for one or more point $P_{i,j}$ of said first frontier Fi;
for a second frontier Fk;
for one or more point $P_{k,l}$ of said second frontier Fk;
compute $y_{i,j,k,l} = f_m(P_{i,j}, P_{k,l})$ where $f_m$ is the function $f_1$, $f_2$ or $f_3$,
according to said one or more zone being determined;
select one or more particular couple $P_{k,l-1*}$, $P_{k,l*}$ for which $y_{i,j,k,l-1}$ and $y_{i,j,k,l}$ satisfy the condition $C_m$, where $C_m$ is the condition $C_1$, $C_2$ or $C_3$, according to the one or more zone being determined;
select a particular point $P_{k,l***}$ among said one or more particular couple $P_{k,l-1*}$, $P_{k,l*}$ according to a further condition $C_s$;
store the couple $P_{i,j}$, $P_{k,l***}$.

16. The method of claim 10, wherein the step of computing new faces calls, for each determined zone, a face computation routine adapted to the type of said determined zone.

17. The method of claim 16, further comprising a step of modifying, using said at least one computer processor, modeled object data faces according to the new faces computed.

18. The method of claim 1, wherein the three-dimensional geometrical figure comprises a sphere of radius r touching said face at said point of the tessellated representation of said face.

19. The method of claim 1, wherein the three-dimensional geometrical figure comprises two spheres of respective radii rx and rc, tangential at said point of the tessellated representation of said face.

20. The method of claim 1, wherein the three-dimensional geometrical figure comprises a cone and wherein, at the step of determining and storing data representative of an intersection of the three-dimensional geometrical figure, said figure is touching said point and is given a specific longitudinal and latitudinal angles.

21. A computer readable storage medium whose contents cause a computer system to design a modeled object having several faces, by:
identifying, for each of said faces, at least another of said faces related to said face according to geometrical criteria;
computing a plurality of points forming a tessellated representation of each of said faces; wherein
for each of said faces;
for each point of the tessellated representation of said face;
determining and storing data representative of an intersection between a three-dimensional geometrical figure extrinsic to said modeled object and touching said point and another face identified as a face related to said face;
computing frontiers between points according to their respectively stored data;
determining zones according to the computed frontiers; and
computing new faces according to the determined zones.

* * * * *